United States Patent
Hoppe et al.

(10) Patent No.: US 8,273,469 B2
(45) Date of Patent: Sep. 25, 2012

(54) PISTON RING

(75) Inventors: Steffen Hoppe, Overath (DE); Manfred Fischer, Leichlingen (DE); Christiane Bauer, Burscheid (DE); Ralf Lammers, Wermelskirchen (DE)

(73) Assignee: Federal-Mogul Burscheid GmbH, Burscheid (DE)

( * ) Notice: Subject to any disclaimer, the term of this patent is extended or adjusted under 35 U.S.C. 154(b) by 350 days.

(21) Appl. No.: 12/664,462

(22) PCT Filed: Jun. 12, 2008

(86) PCT No.: PCT/EP2008/057411
§ 371 (c)(1),
(2), (4) Date: Dec. 14, 2009

(87) PCT Pub. No.: WO2008/152104
PCT Pub. Date: Dec. 18, 2008

(65) Prior Publication Data
US 2010/0171272 A1 Jul. 8, 2010

(30) Foreign Application Priority Data
Jun. 13, 2007 (DE) .......... 10 2007 027 245

(51) Int. Cl.
*B32B 9/00* (2006.01)
(52) U.S. Cl. ............. 428/697; 204/192.38; 428/336; 428/469; 428/472; 428/698; 428/699
(58) Field of Classification Search ............ 204/192.38; 277/310, 440, 442; 428/336, 469, 472, 697, 428/698, 699
See application file for complete search history.

(56) References Cited

U.S. PATENT DOCUMENTS

| | | | |
|---|---|---|---|
| 5,549,086 A | 8/1996 | Ozawa et al. | |
| 6,688,769 B2 * | 2/2004 | Takayanagi et al. | 384/276 |
| 7,060,345 B2 * | 6/2006 | Fukui et al. | 428/697 |
| 7,159,640 B2 * | 1/2007 | Inoue et al. | 164/312 |
| 7,267,344 B2 * | 9/2007 | Fischer et al. | 277/443 |
| 7,587,919 B1 * | 9/2009 | Young | 76/107.1 |
| 2008/0095939 A1 | 4/2008 | Fischer et al. | |

FOREIGN PATENT DOCUMENTS

| | | |
|---|---|---|
| DE | 19931829 A1 | 1/2001 |
| DE | 102004028486 A1 | 12/2005 |
| DE | 102006046917 B3 | 2/2008 |
| EP | 0 702 097 A1 | 3/1996 |
| JP | 06-330348 * | 11/1994 |
| JP | 2001-335878 * | 12/2001 |
| JP | 2002-256967 * | 9/2002 |
| JP | 2005-60810 A | 3/2005 |
| JP | 2005187859 A | 7/2005 |
| WO | WO 03/007099 A1 | 11/2003 |

OTHER PUBLICATIONS

Uchinda et al "Friction and wear properties of CrAIN and CrVN films deposited by cathodic arc ion plating method" Suface & Coating Techn 177-178 2004 p. 627-630.*
Lamni R et al.: Microstructure and Nonohadness Porperties of Zr-Al-N and Zr-Cr-N Thin Films, Journal of Vacuum Science and Technology: Part A, AVS/AIP, Melville, NY, US, Bd. 23, Jul. 2005.

* cited by examiner

*Primary Examiner* — Archene Turner
(74) *Attorney, Agent, or Firm* — Robert L. Stearn; Dickinson Wright PLLC

(57) ABSTRACT

Disclosed is a piston ring comprising a supporting material and a wear-resistant coating. The wear-resistant coating is composed of a ternary system A-B—N which is applied using a PVD process and in which A and B each represent an element form the group encompassing Ti, Zr, Hf, V, Nb, Ta, Cr, Mo W, Al, Si and C, wherein A≠B and N represents nitrogen. The thickness of the wear-resistant coating amounts to $\geq 3$ μm.

24 Claims, No Drawings

PISTON RING

BACKGROUND OF THE INVENTION

1. Technical Field

The invention is directed to a piston ring.

2. Related Art

Piston rings are provided with wear protection layers on their running surfaces and/or ring flanges, in order to achieve the required life span. High cylinder pressures, direct injection, exhaust gas recycling, and other design features in recent engine developments, as well as alternative cylinder materials make increasing demands on piston rings.

Wear resistant layers are applied by means of thermal spraying processes, plating processes or thin layer technologies, and where required, are further processed through heat treatments or diffusion processes. Normally, the layers are substantially homogenous, and are therefore applied in an unstructured form. The wear resistance is adjusted through the corresponding hardness of the material.

All forms of phenomena which indicate thermal overload on the surface of the piston ring are typically grouped under the concept of scorch marks.

From DE 199 31 829 A1 there is known a plated hard chrome layer, which possesses crevices, in which are embedded diamond particles with a size of 0.25 to 0.5 µm. In addition, further particles of hard materials consisting of tungsten carbide, chrome carbide, aluminium oxide, silicon carbide, silicon nitride, boron carbide or boron nitride can be embedded in the crevices.

When high temperatures occur, the diamond particles are converted into graphite, which then assumes the function of a lubricant, and therefore prevents the formation of scorch marks. Thus, this layer also possesses good emergency operating characteristics, in particular due to the conversion of diamond into graphite at temperatures of approx. 700° C. or higher.

In order to make further improvements in the scorch mark behaviour of piston rings, layers of materials have hitherto typically been used, which have very high melting points, and which consequently need very high temperatures in order to cause their thermal overload. A typical example for these is chrome nitride, which is applied by means of a PVD process, and has a decomposition temperature of approx. 2,000 K.

In order to improve resistance to scorch marks and wear resistance, there is proposed in DE 10 2004 028 486 A1 a coating of several individual layers, which consist alternately of chrome and chrome nitride. The chrome nitride layers may consist of CrN, Cr2N or mixtures thereof. In order to avoid abrupt transitions, the coating process is so controlled that the individual layers of chrome nitride each possess a border of Cr2N and a core of CrN. Each individual layer is at least 0.01 µm thick. The maximum thickness is 10 µm. The total thickness of the coating is given as 5 to 100 µm.

U.S. Pat. No. 5,549,086 discloses piston ring coatings in TiN and CrN.

German DE 10 2004 032 403 B3 describes piston rings, which possess a graded CrN coating over a chrome adhesion layer, such coating having a nitrogen content which increases towards the outside.

From JP 2005-060810 A there are known piston rings for combustion engines, which are provided with a multiple layer coating system, the individual layers of which possess the same metallic components, and which only vary in their nitrogen content. The layer thicknesses of the individual layers are given as <1 µm. The layers are applied by means of a PVD process, in particular an arc process.

However, the resistance to scorch marks of the known layers is not satisfactory.

Lamni et al. J. VrC. Technol. A23 (4), 2005 Page 593 ff describes the microstructures and the nano-hardness of layers consisting of the three-component material systems Zr—Al—N and Zr—Cr—N. The layers are applied by magnetron sputtering, and have a thickness of 1 µm. With respect to the three-component material system $Zr_{1-x}Cr_xN$ within the range of $0 \leq x \leq 0.48$ no change in the nano-hardness was detected.

It is the purpose of the invention to disclose a piston ring with a wear-resistant coating, which possesses a high degree of wear resistance.

SUMMARY OF THE INVENTION AND ADVANTAGES

This purpose is achieved by means of a piston ring which is thereby characterized that the wear-resistant coating consists of a three-component material system A-B-N, which is applied by means of a PVD process, in which A and B are each an element from the group Ti, Zr, Hf, V, Nb, Ta, Cr, Mo, W, Al, Si and C where $A \neq B$ and N is nitrogen and where the thickness of the wear-resistant coating $\geq 3$ µm.

It has been shown that when compared with a two-component system A-N, such as, for example, CrN, the presence of a further element from the group B permits the adjustment of the hardness over a wide range in a simple manner. This makes it possible to adjust the required hardness for the particular requirements of an application in an engine.

The group of PVD process includes the technologies listed below, as well as reactive variants of these processes:

Vaporization processes
 Thermal vaporization (also known as evaporation)
 Electron beam evaporation
 Pulsed Laser Deposition, Pulsed laser ablation: Atoms and ions are evaporated by means of a short intensive laser pulse.
 Arc-PVD evaporation: Atoms and ions are released from the source material and converted into a gaseous phase by means of a powerful current, which flows between two electrodes in an electric discharge.
 Molecular beam epitaxy
 Sputtering (Sputter deposition, cathodic atomization): The source material is atomized by means of ion bombardment and is converted into the gaseous phase.
 Ion plating Preferably the wear-resistant coating consists of a three-component system on the basis CrN.

One wear-resistant layer is preferred consisting of $Zr_{1-x}Cr_xN_y$, in which x=0.1 to 0.85 and y=0.5 to 1, and in particular where x=0.22 to 0.82 and y=0.94 to 0.98. The range in which x=0.44 to 0.85 and y=0.8 to 1 is particularly preferred.

Further preferred three-component systems are $V_{1-x}Cr_xN_y$ and $Ti_{1-x}Cr_xN_y$.

Preferably, the wear-resistant coating consists of $V_{1-x}$, $Cr_xN_y$ where x=0.85 to 0.10 and y=0.5 to 1, and particularly where x=0.3 to 0.8 and y=0.5 to 1.

Furthermore, preference is given to the system $Ti_{1-x}$, $Cr_xN_y$, where x=0.10 to 0.85 and y=0.5 to 1, particularly where x=0.6 to 1 and y=0.5 to 1.

Preferably, the thickness of the wear-resistant coating is 5 to 60 µm µm, particularly with 5 to 15 µm and 25 to 35 µm.

Preferably, the thickness of the wear-resistant coating is 3 to 4 µm, particularly 3.2 to 3.7 µm or 5 to 7 µm, and especially for 5.7 to 6.5 µm and 10 to 14 µm, especially 11 to 13 µm.

The wear-resistant coating is preferably applied by means of a reactive arc process (Arc-PVD). The advantage of this process lies in the fact that, in contrast to sputter processes, a higher basic hardness can be set. This is due to the different structural texture of the wear-resistant coating.

When considering three-component systems, it should be borne in mind that it is possible that small quantities of oxygen and other impurities are contained within the three-component system. The magnitude of the oxygen proportion is up to 5 at %.

EXAMPLES

In order to prevent wear on piston rings, multi-layer coatings (with an adhesion layer of chrome) were deposited using a reactive arc process. These were nitrided piston rings in a high alloy steel. The wear-resistant coatings consisted of different compositions of the systems Cr—V—N, Cr—Zr—N and Cr—Ti—N. Three different compositions were investigated in each case.

The following tables list the coating thicknesses and the coating hardnesses. In order to check the wear-resistance, these prepared piston rings were subjected to representative tests under lubricated, reciprocating, sliding, and loading. The mating surface in each case consisted of a segment of a cylinder guide in cast iron (GOE 300, material of the applicant). In order to reduce the timescale, a synthetic ester without additives was used as a lubricant. The representative tests A and B differ in the stroke length. Representative test A was carried out with a longer stroke.

|  |  | Layer Hardness | | |
| --- | --- | --- | --- | --- |
|  | HV 0.1 | Cr—(V—)N 2135 | Cr—V—N 2122 | (Cr—)V—N 2394 |
| V-content | at % | 14.2 | 31 | 44.7 |
| Cr-content | at % | 41 | 23.3 | 8.7 |
| N-content | at % | 42.8 | 44.5 | 45.6 |
| Model test A | Wear |  |  |  |
| Ring | μm | 1 | 0 | 1 |
| Mating body | μm | 67.5 | 76 | 55.5 |
| Layer thicknesses | μm | 5.7 | 5.7 | 6.5 |

|  |  | Layer Hardness | | |
| --- | --- | --- | --- | --- |
|  | HV 0.1 | Cr—(Zr—) N 1855 | Cr—Zr—N 2025 | (Cr—)Zr—N 2392 |
| Zr-content | at % | 12 | 27 | 40 |
| Cr-content | at % | 41 | 24 | 11 |
| N-content | at % | 48 | 47 | 47 |
| Model test A | Wear |  |  |  |
| Ring | μm | 2.5 | 3.5 | 3 |
| Mating body | μm | 75 | 53.5 | 60 |
| Layer thicknesses | μm | 3.2 | 3.2 | 3.7 |

|  |  | Layer Hardness | | |
| --- | --- | --- | --- | --- |
|  | HV 0.05 | Cr—(Ti—)—N 1502 | Cr—Ti—N 1977 | (Cr—)Ti—N 2246 |
| Ti-content | at % | 12 | 23 | 40 |
| Cr-content | at % | 43 | 32 | 13 |
| N-content | at % | 43 | 40 | 43 |
| 0-content | at % | 2 | 5 | 4 |
| Model test B | Wear |  |  |  |
| Ring | μm | 1.25 | 1 | 1 |
| Mating body | μm | 9 | 7 | 4 |
| Layer thicknesses | μm | 11 | 12 | 13 |

The presence of an additional metal in CrN layers influences the layer properties. With a higher proportion of the added metal (Vanadium, Zirconium or Titanium) the hardness can be increased. These innovative layers make it possible to adjust the required hardness of a particular application in an engine.

Furthermore it is possible, on the basis of the composition of the PVD layers, to adjust the wear performance of the PVD layer and of the cylinder mating surface sometimes over very wide ranges. One of the most important characteristics of the piston ring, the wear-resistance of the running surface can be optimised and adjusted using these innovative layers. It is now possible in the field of rings for large pistons to correspond in nuances with the requirements for the wear of the piston and of the cylinder mating surface. For example, in the field of rings for large pistons, a lower wear of the cylinder running surface is called for, so that during maintenance only the ring needs to be changed, instead of changing the cylinder liner, which is very expensive and complicated to replace. On the other hand, in the field of passenger car engines, it is expected that the paring of piston ring/cylinder mating surface will overall still offer minimal wear and therefore good exhaust gas values, even after high operating performance.

What is claimed is:

1. A piston ring with a support material and a wear-resistant coating, wherein, the wear-resistant coating consists of a three-component system A-B—N applied by means of a PVD process, in which A and B are each an element from the group Ti, Zr, Hf, V, Nb, Ta, Mo, W, Al, Si and C in which A≠B and N is nitrogen, and the thickness of the wear-resistant coating is ≧3 μm.

2. A piston ring in accordance with claim 1, wherein the thickness of the wear-resistant coating is 5 to 60 μm.

3. A piston ring in accordance with claim 2, wherein the thickness of the wear-resistant coating is 5 to 15 μm.

4. A piston ring in accordance with claim 2, wherein the thickness of the wear-resistant coating is 25 to 35 μm.

5. A piston ring in accordance with claim 1, wherein the wear-resistant coating is applied by means of a reactive arc process.

6. A piston ring in accordance with claim 1, wherein the support material consists of steel or a cast iron material.

7. A piston ring, comprising:
a support material,
a wear-resistant coating disposed on the support material, the wear-resistant coating being applied by a PVD process and having a thickness of >3 μm, and
the wear resistant coating including Cr in an amount of 8.7 to 41 atomic percent, V in an amount of 14.2 to 44.7 atomic percent, and N in an amount of 42.8 to 45.6 atomic percent.

8. A piston ring in accordance with claim 7, wherein the thickness of the wear-resistant coating is 5 to 60 μm.

9. A piston ring in accordance with claim 8, wherein the thickness of the wear-resistant coating is 5 to 15 μm.

10. A piston ring in accordance with claim 8, wherein the thickness of the wear-resistant coating is 25 to 35 μm.

11. A piston ring in accordance with claim 7, wherein the wear-resistant coating is applied by means of a reactive arc process.

12. A piston ring in accordance with claim 7, wherein the support material consists of steel or a cast iron material.

13. A piston ring, comprising:
a support material,
a wear-resistant coating disposed on the support material, the wear-resistant coating being applied by a PVD process and having a thickness of >3 μm, and the wear resistant coating including Cr in an amount of 11 to 41 atomic percent, Zr in an amount of 12 to 40 atomic percent, and N in an amount of 47 to 48 atomic percent.

14. A piston ring in accordance with claim 13, wherein the thickness of the wear-resistant coating is 5 to 60 µm.

15. A piston ring in accordance with claim 14, wherein the thickness of the wear-resistant coating is 5 to 15 µm.

16. A piston ring in accordance with claim 14, wherein the thickness of the wear-resistant coating is 25 to 35 µm.

17. A piston ring in accordance with claim 13, wherein the wear-resistant coating is applied by means of a reactive arc process.

18. A piston ring in accordance with claim 13, wherein the support material consists of steel or a cast iron material.

19. A piston ring, comprising:
a support material,
a wear-resistant coating disposed on the support material,
the wear-resistant coating being applied by a PVD process and having a thickness of >3 µm, and
the wear resistant coating including Cr in an amount of 13 to 43 atomic percent, Ti in an amount of 12 to 40 atomic percent, and N in an amount of 40 to 43 atomic percent.

20. A piston ring in accordance with claim 19, wherein the thickness of the wear-resistant coating is 5 to 60 µm.

21. A piston ring in accordance with claim 20, wherein the thickness of the wear-resistant coating is 5 to 15 µm.

22. A piston ring in accordance with claim 20, wherein the thickness of the wear-resistant coating is 25 to 35 µm.

23. A piston ring in accordance with claim 19, wherein the wear-resistant coating is applied by means of a reactive arc process.

24. A piston ring in accordance with claim 19, wherein the support material consists of steel or a cast iron material.

* * * * *